US005111101A

United States Patent [19]

Imoto

[11] Patent Number: 5,111,101

[45] Date of Patent: May 5, 1992

[54] DEVICE FOR MAGNIFYING DISPLACEMENT OF PIEZOELECTRIC ELEMENT AND METHOD OF PRODUCING THE SAME

[75] Inventor: Yasuo Imoto, Nagoya, Japan

[73] Assignee: Brother Kogyo Kabushiki Kaisha, Nagoya, Japan

[21] Appl. No.: 576,843

[22] Filed: Sep. 4, 1990

[30] Foreign Application Priority Data

Sep. 5, 1989 [JP] Japan .................................. 1-229948

[51] Int. Cl.$^5$ ............................................ H01L 41/08

[52] U.S. Cl. .................................... 310/328; 29/25.35

[58] Field of Search ........................ 29/25.35; 310/328

[56] References Cited

U.S. PATENT DOCUMENTS 4,406,966 9/1983 Paros .................................. 310/321
4,874,978 10/1989 Sakaida et al. ...................... 310/328

FOREIGN PATENT DOCUMENTS 0087991 9/1983 European Pat. Off. ........... 29/25.35
0295102 12/1988 European Pat. Off. .
0352075 1/1990 European Pat. Off. .

*Primary Examiner*—Mark O. Budd
*Assistant Examiner*—Thomas M. Dougherty
*Attorney, Agent, or Firm*—Jones, Tullar & Cooper

[57] ABSTRACT

A device for magnifying displacement of a piezoelectric element at a printing head is proposed. The displacement of a column shaped piezoelectric element due to applied voltage is transmitted to a contact member and is magnified via a displacement magnifying mechanism to drive a printing wire connected to the displacement magnifying mechanism. A temperature compensating member is disposed between a frame supporting the piezoelectric element and the piezoelectric element and/or between the contact member and the piezoelectric element, and gives a preload to the piezoelectric element to support in a fixed manner the piezoelectric element between the frame and the contact member. The temperature compensating member is plastically deformed to compensate for the deformation of the piezoelectric element due to temperature change.

9 Claims, 5 Drawing Sheets

DEVICE FOR MAGNIFYING DISPLACEMENT OF PIEZOELECTRIC ELEMENT AND METHOD OF PRODUCING THE SAME

BACKGROUND OF THE INVENTION

1. Field of the Invention

The present invention relates to a device for magnifying displacement of a piezoelectric element and a method of producing the same. The present invention also relates to printing heads including such a displacement magnifying device.

2. Description of the Related Art

One common application for devices for magnifying the displacement of a piezoelectric element is in printing heads. Such devices have a piezoelectric element disposed between a frame base portion and a contact member, and magnify displacement of the contact member according to the expansion amount of the piezoelectric element. In this type of device, if a gap develops between the frame base portion or the contact member and the piezoelectric element, the displacement of the contact member is reduced due to the gap. This decreases the magnifying rate of the displacement to the expansion amount of the piezoelectric element, which decreases the displacement magnifying rate of the device.

The expansion of the piezoelectric element is very slight. For the purpose of correctly transmitting the slight expansion to the device via the contact member, it is necessary to assemble the piezoelectric element between the frame base portion and the contact member without a gap and to apply a predetermined load to the piezoelectric element.

Such a displacement magnifying device is disclosed in European Laid-Open Patent Publication No. EP 0295 102 A2 published on Dec. 14, 1988, which corresponds to U.S. Pat. No. 4,874,978.

In the device disclosed therein as shown in FIG. 12, a pair of upper and lower wedge members 53*a*, 53*b* are interposed between the lower end of a piezoelectric element 55 and the upper end surface of a base portion 51*a* of a frame 51. Both wedge members 53*a*, 53*b* are formed of a material having a linear expansion characteristic different from that of the piezoelectric element 55, so that the expansion and contraction of the piezoelectric element 55 due to temperature change may be compensated for by the deformation of the wedge members 53*a*, 53*b*. Thus, the height of the piezoelectric element 55 above the upper surface of the base portion 51*a* is maintained at a constant level.

The engagement of the tapered surfaces of the wedge members 53*a*, 53*b* also applies on appropriate compression load to the piezoelectric element 55, so that the piezoelectric element 55 is supported in a fixed manner between the frame 51 and a contact member 54 without a gap. Therefore, the displacement amount of the piezoelectric element 55 in accordance with the applied voltage is accurately transmitted to a magnifying mechanism 57 to actuate a printing wire 56.

However, the above device requires a pair of mating wedge members in the narrow space of the print head. This causes difficulties in the assembly process which results in increased production cost.

SUMMARY OF THE INVENTION

Accordingly, a primary object of the present invention is to provide a device for magnifying displacement of a piezoelectric element which requires less parts and has a simplified design, and a method for producing the same, resulting in reducing the production cost.

Another object of the present invention is to provide a device for magnifying displacement of a piezoelectric element in which a preload is applied to the piezoelectric element without an excessive load to achieve a longer using period, and a method for producing the same.

Still another object of the present invention is to provide a printing head which has the aforementioned device for magnifying displacement of the piezoelectric element, and a method for producing the same.

According to a first aspect of the present invention, the longitudinal expansion of a column shaped piezoelectric element is magnified by a displacement magnifying mechanism. The piezoelectric element is disposed between a frame and a contact member. Then, a temperature compensating member having temperature expansion characteristics different from up those of the piezoelectric element is fitted between the frame and the piezoelectric element or between the piezoelectric element and the contact member. Pressure is then applied to the temperature compensating member in the direction perpendicular to the longitudinal direction of the piezoelectric element and is plastically deformed in the longitudinal direction.

The displacement of the contact member or of the displacement magnifying mechanism caused by the plastic deformation is measured, and when the measured displacement reaches a predetermined value, the pressure to the temperature compensating member is released.

According to a second aspect of the present invention, a piezoelectric element is used for a printing head in which the expansion of the column shaped piezoelectric element is magnified by the displacement magnifying mechanism and is transmitted to drive a printing wire.

According to a third aspect of the present invention, a piezoelectric element expands along its length in accordance with applied voltages. It also has a frame and sub frame. The frame extends along the length of the piezoelectric element and supports a first end of the piezoelectric element. The sub frame extends along the side edge of the piezoelectric element at the opposing side to the frame substantially in parallel with the expansion direction. A contact member is disposed at a second end of the piezoelectric element and is displaced according to the expansion of the piezoelectric element. A displacement magnifying mechanism is mechanically connected to the contact member and operates according to the displacement of the contact member.

Temperature compensating means is provided either/both between the frame and the piezoelectric element or/and and/or between the contact member and the piezoelectric element. The temperature compensating means applies a preload to hold the piezoelectric element immovably between the frame and the contact member. The temperature compensating means is plastically deformed and compensates for the deformation of the piezoelectric element caused by temperature changes. Thus, the displacements of the piezoelectric element caused by temperature changes are eliminated.

BRIEF DESCRIPTION OF THE DRAWINGS

The features of the present invention that are believed to be novel are set forth with particularity in the appended claims. The invention, together with the objects and advantages thereof, may best be understood by reference to the following description of the presently preferred embodiments together with the accompanying drawings in which:

DETAILED DESCRIPTION OF THE PREFERRED EMBODIMENTS

Figure 3:
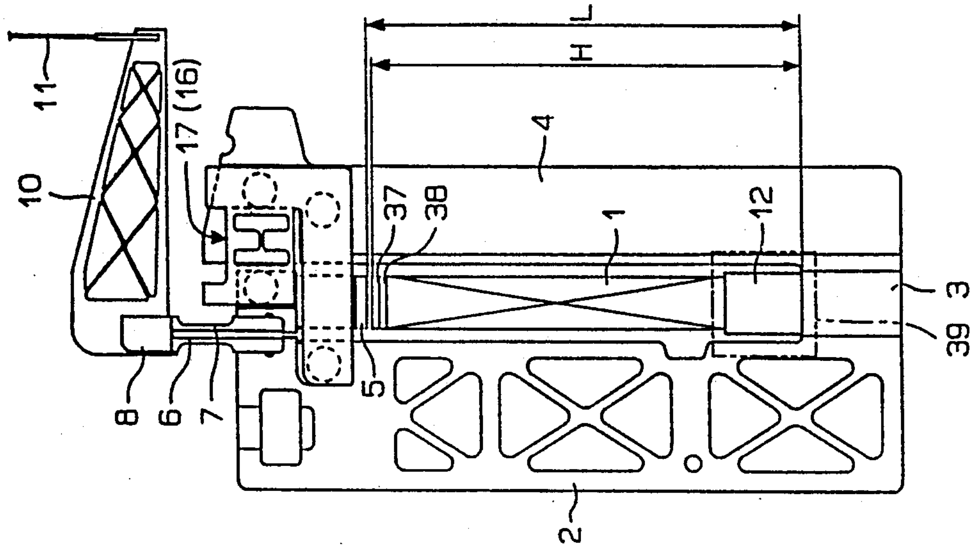
FIG. 3 is a side view showing the frame and the contact member with the piezoelectric element and the temperature compensating member therebetween.

As illustrated in the drawings, a preferred first embodiment of the present invention will be described in detail hereinafter.

Figure 6:
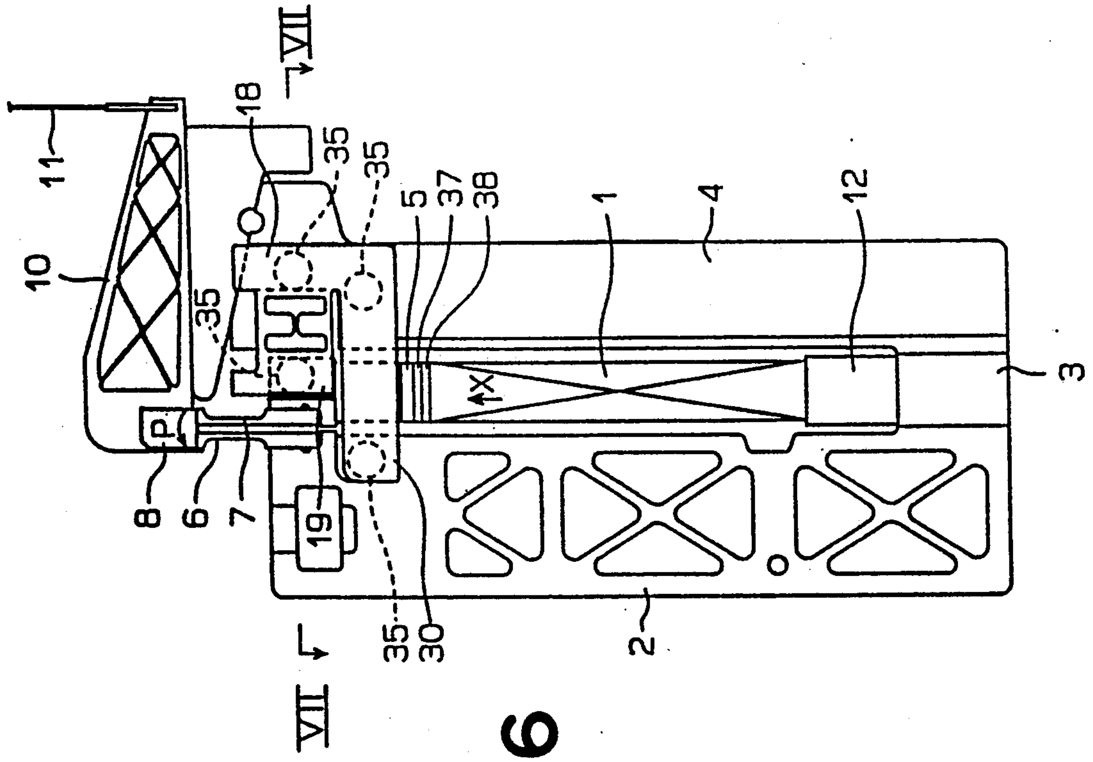
FIG. 6 is a side view of a displacement magnifying device according to a first embodiment of the present invention.

As shown in FIG. 6, a piezoelectric element 1 is formed of a plurality of laminated piezoelectric ceramic plates and has a column shape. The element 1 can expand and contract vertically in accordance with voltage applied thereto.

A frame 2 supports the piezoelectric element 1 and extends substantially in parallel with the expansion direction of the element 1. By way of example, the frame 2 may be made of a rectangular metal plate. A base portion 3 is disposed at one end of the frame 2, projecting laterally. The base portion 3 supports a lower end of the piezoelectric element 1 by way of a temperature compensating member 12.

A contact member 5 is disposed at an upper end of the piezoelectric element 1, opposing an upper portion of the frame 2. The contact member 5 is vertically displaced in accordance with the expansion and contraction of the element 1. The lower portions of leaf springs 6 and 7 are fixed to opposing surfaces of the frame 2 and of the contact member 5, respectively, by means of brazing. The leaf springs 6 and 7 oppose each other with a predetermined space therebetween and project upward, in the expansion direction of the piezoelectric element 1, from upper surfaces of the frame 2 and of the contact member 5 to a predetermined length. A rocking block 8 is integrally connected to the projections of the leaf springs 6 and 7.

A rocking arm 10 is fixed at its proximal end to the rocking block 8 and at its distal end to a printing wire 11. The leaf springs 6, 7, the rocking block 8, and the rocking arm 10 compose a displacement magnifying mechanism which magnifies and transmits the expansion and contraction movements of the piezoelectric element 1 to the printing wire 11.

A lower portion of a sub frame 4 is integrally formed with the base portion 3. The sub frame 4 extends vertically along the length of the piezoelectric element 1 opposing the frame 2. An upper end of the sub frame 4 reaches a position opposing the contact member 5.

Figure 8:
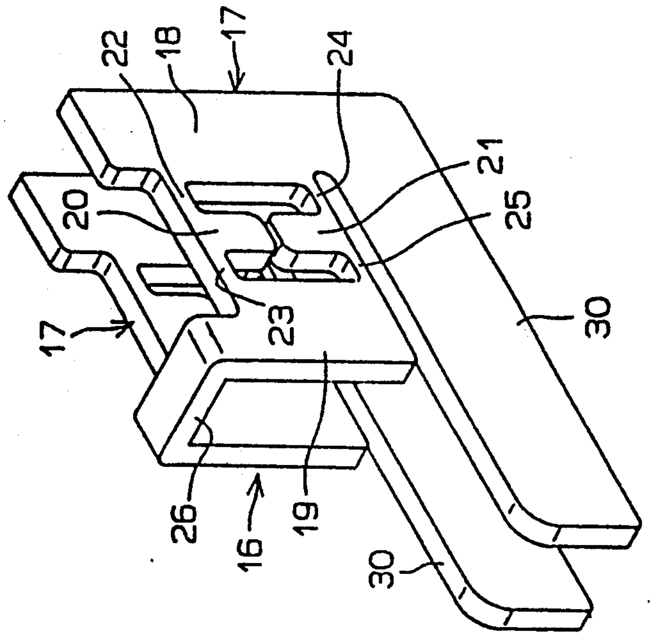
FIG. 8 is a perspective view of a linkage.
Figure 12:
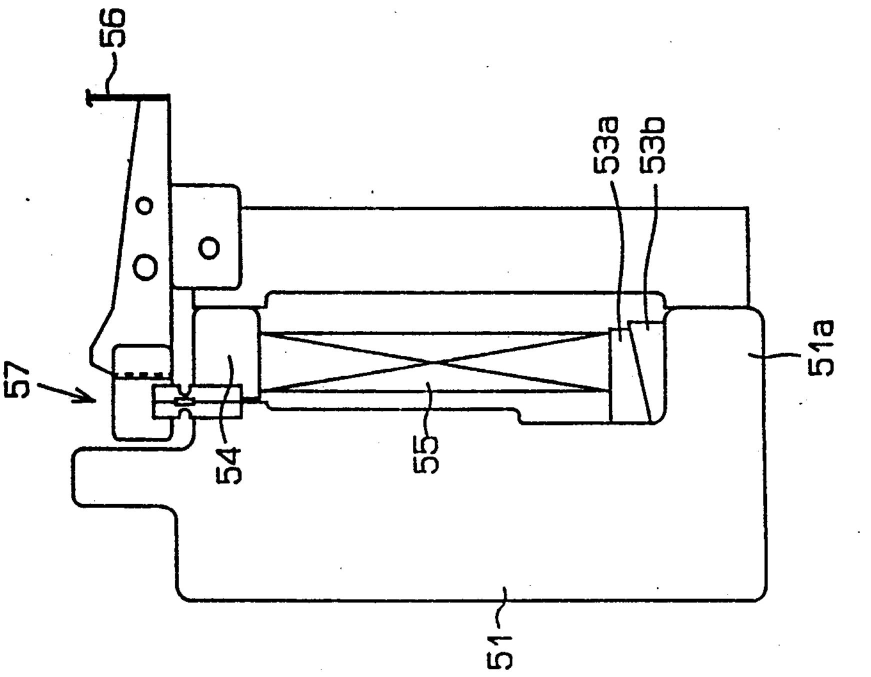
FIG. 12 (PRIOR ART)
FIG. 12 is a side view of a prior art displacement magnifying device.

The upper end of the sub frame 4 is connected to the contact member 5 by way of a linkage 16. As shown in FIG. 8, the linkage 16 is formed by dieing-out-pressing and bending an elastically deformable plate and is substantially composed of a pair of link plates 17 and a bridge 26 which connects the link plates 17 together.

Each link plate 17 has spaced apart vertical arms 18, 19 which extend in parallel with the piezoelectric element 1. Each link plate 17 also includes cross bars 20, 21 which connect the vertical arms 18, 19 together. In addition, a connecting plate 30 is disposed at the arm 18, projecting from a lower portion of the vertical arm 18 to a side surface of the frame 2.

Figure 9:
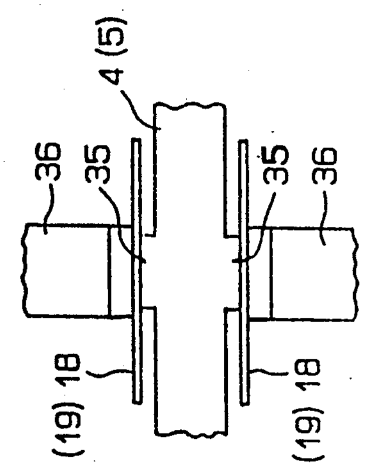

Projections 35 used for welding the linkage 16 are provided on the frame 2, the sub frame 4, and the contact member 5 (shown in FIG. 9). Spot electrodes 36 are brought into contact with side surfaces of the vertical arms 18, 19 and the connecting plate 30, and are placed at positions corresponding to the projections 35. The electrodes 36 then exert pressure to each other to perform welding.

Figure 10:
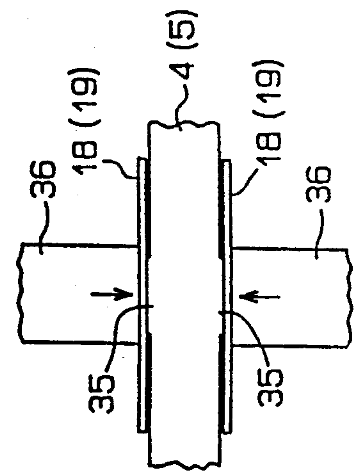
FIG. 9 and 10 are diagramatic views successively showing steps for spot-welding the linkage between the contact member and the sub frame.

The spot welding with projections is especially effective when the frame 2, the sub frame 4, and the contact member 5 are made of sintered metal. Spot-welding of sintered metal often causes depression on the metal surface as holes in the metal are broken by the pressing force of the electrodes. However, the projections 35 compensate for the depression as shown in FIG. 10. Thus, the vertical arms 18, 19 and the connecting plate 30 are welded to the frame 2, the sub frame 4, and the contact member 5 without deflection or deformation.

The linkage 16 guides the contact member 5 along the longitudinal direction of the piezoelectric element 1 in accordance with the expanding and contracting movements of the piezoelectric element 1.

Figure 2:
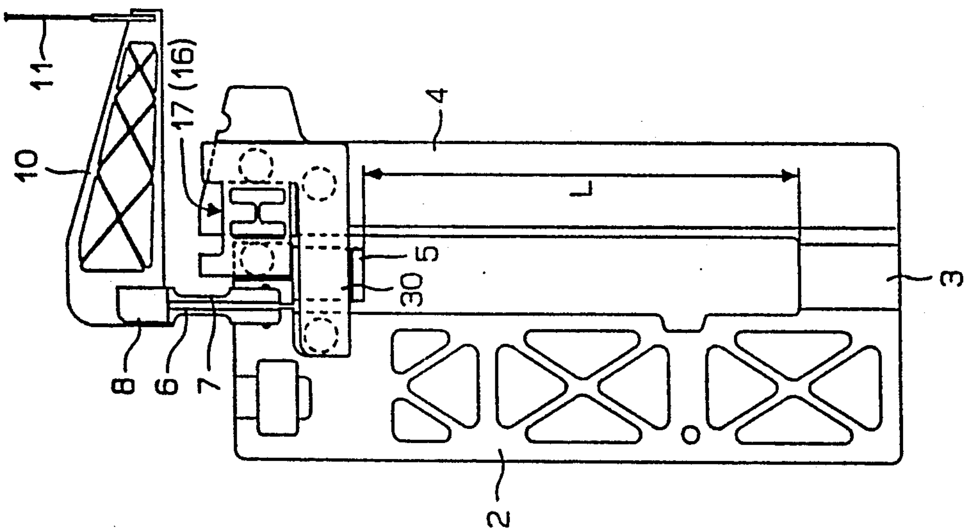
FIG. 2 is a side view showing the frame and the contact member without the piezoelectric element and the temperature compensating member assembled therebetween.

As shown in FIG. 2, the link plates 17 and the connecting plates 30 are assembled to the frame 2, the sub frame 4, and the contact member 5. Then, the temperature compensating member 12, the piezoelectric element 1, and a strike plate 37 and a spacer 38 are assembled between the base portion 3 of the frame 2 and the contact member 5 in the following steps. By way of example, the spacer 38 may be made of zirconia ceramic having good wear resistance. The temperature compensating member 12 is made of a material having temperature linear-expansion characteristics different from those of the piezoelectric element 1. For example such a material may be zinc and aluminum alloy. The temperature compensating member 12, therefore, expands and contracts to compensate for the deformation of the piezoelectric element 1 caused by temperature changes so as to prevent the upper surface position of the element 1 from being displaced due to temperature changes. The strike plate 37 and the spacer 38 prevent the piezoelectric element 1 from wearing due to contacts with the contact member 5.

The assembling steps will be explained hereinafter.

Figure 1:
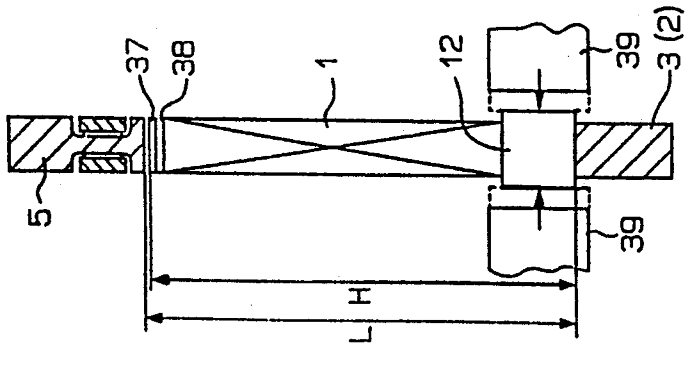
FIG. 1 is a front sectional view showing a piezoelectric element and a temperature compensating member assembled between a frame and a contact member.

In the first step, the temperature compensating member 12, the piezoelectric element 1, the strike plate 37 and the spacer 38 are assembled between the base portion 3 and the contact member 5 as shown in FIGS. 1 and 3. By way of example, a cubic aluminum block thicker than the base portion 3 is used as the temperature compensating member 12. Thermosetting adhesive is previously applied to at least one of each opposing surface formed between the base portion 3, the temperature compensating member 12, the piezoelectric element 1, the strike plate 37, the spacer 38, and the contact member 5, except for the opposing surfaces between the strike plate 37 and the spacer 38.

An interval L between the base portion 3 and the contact member 5 is set larger to some extent than the overall heights H of the temperature compensating member 12, the piezoelectric element 1, the strike plate 37, and the spacer 38. Accordingly, the temperature compensating member 12, the piezoelectric element 1, the strike plate 37, and the spacer 38 are easily assembled between the base portion 3 and the contact member 5.

Figure 5:
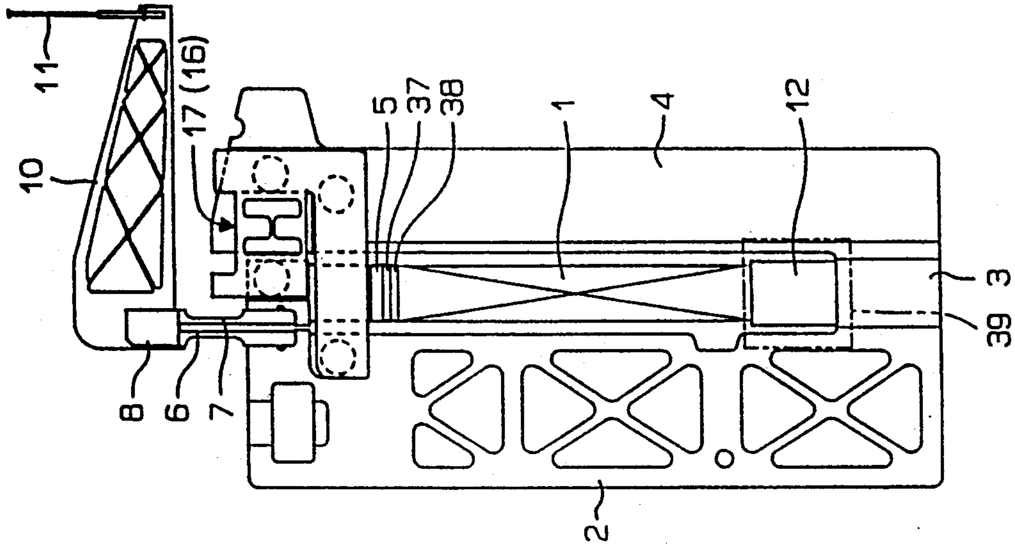
FIG. 5 is a side view of FIG. 4.
Figure 4:
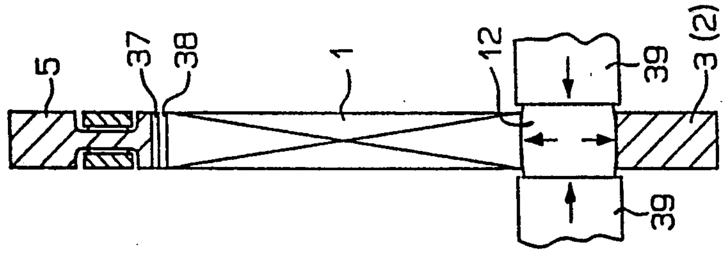
FIG. 4 is a front sectional view showing the temperature compensating member plastically deformed by the pressure applied on its sides.
Figure 7:
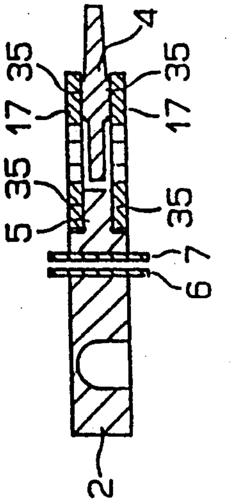
FIG. 7 is a sectional view taken along a VII—VII line of FIG. 6.

In the second step, as shown in FIGS. 4 and 5, a pair of preload presses 39 of a flash jig are placed against the side surfaces of the temperature compensating member 12. The preload presses 39 are gradually drawn together to apply a pressure against the side surfaces of the temperature compensating member 12. The pressing force is applied in the direction perpendicular to the longitudinal direction of the piezoelectric element 1 to plastically deform the temperature compensating member 12 in the longitudinal direction. Therefore, the opposing surfaces of the base portion 3, the temperature compensating member 12, the piezoelectric element 1, the strike plate 37, the spacer 38 and the contact member 5 contact one another without any gaps therebetween. The contact member 5 is also displaced upward, slightly deflecting the leaf springs 6, 7. Thus, the elastic force of the springs 6, 7 and of the link plate 17 provides a compressing load to the piezoelectric element 1.

In the third step, a measuring device (not shown) such as a laser measuring device or the like disposed adjacent to the rocking arm 10 measures a tilt angle displacement of the rocking arm 10 as the preload presses 39 are applying a pressure during the second step. The displacement of the contact member 5 may also be measured instead in the third step.

In the fourth step, when the tilt angle displacement of the rocking arm 10 (or the contact member displacement) reaches a predetermined value, the preload presses 39 stop pressing the temperature compensating member 12 and return to the original positions.

In the final step, the aforementioned thermosetting adhesive is hardened by being heated in a furnace, and thus the assembling steps of the piezoelectric element 1 are completed.

Therefore, in the displacement magnifying device to which the piezoelectric element 1 is assembled, the opposing surfaces of each member can be placed in contact with one another without any space therebetween. This allows the exact desired predetermined load to be applied to the piezoelectric element 1 in the longitudinal direction.

As a result, the contact member 5 can be sufficiently displaced according to the expansion of the piezoelectric element 1 (the expansion in the direction S in FIG. 6) caused by the applied voltage. The displacement of the contact member 5 pushes the leaf spring 7 upward relative to the leaf spring 6. The movement of the leaf spring 7 causes bending of both leaf springs 6, 7. When the leaf spring 7 deflects toward the leaf spring 6 a great distance, a torsional moment in the direction of arrow P in FIG. 6 occurs to tilt the rocking arm 10. Thus, the fixed end of the printing wire 11 located at the tip of the rocking arm 10 moves forward to a printing position, guided by guiding members (not shown).

When the application of voltage is stopped, the piezoelectric element 1 contracts to its original length. Thus, the leaf springs 5, 7, the rocking block 8 and the rocking arm 10 are restored to the original positions to make the printing wire 11 return to the primary position.

I the foregoing embodiment, the temperature compensating member 12 is assembled between the base portion 3 and the piezoelectric element 1. However, this compensating member 12 can also be assembled between the contact member 5 and the piezoelectric element 1. In addition, the strike plate 37 and the spacer 38 are not always necessary.

Figure 11:
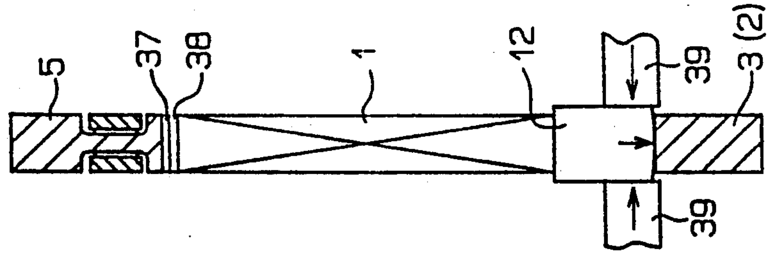
FIG. 11 is a front sectional view of a second embodiment of the present invention.

The second embodiment of the present invention will be explained hereinafter referring to FIG. 11.

In this embodiment, when the side surfaces of the temperature compensating member 12 are pressed by the preload presses 39, only the lower halves of the side surfaces are pressed. In this method, the force applied to the preload presses 39 for deforming the temperature compensating member 12 can be less than half of the force required in the first embodiment. Thus, a fine adjustment of the preload from the piezoelectric element 1 to the contact member 5 can be performed.

In addition, in this embodiment, only the lower halves of the side surfaces are deformed, and the upper halves retain the rectangular shape. Therefore, the upper halves of the temperature compensating member 12 has a plane contact with the piezoelectric element 1. Thus, the bottom surface of the piezoelectric element 1 will not cause a localized stress corresponding to the preload and gives a well-balanced stress. Accordingly, the piezoelectric element 1 will have a longer life.

Although only several embodiments of the present invention have been described herein, it should be apparent to those skilled in the art that the present invention may be embodied in many other specific forms without departing from the spirit or scope of the invention. Particularly, it should be understood that the invention can be modified as follows.

The temperature compensating member 12 may be disposed between the piezoelectric element 1 and the contact member 5. Two temperature compensating members may also be disposed both between the piezoelectric element 1 and the frame 2 and between the piezoelectric element 1 and the contact member 5, respectively.

Therefore the present examples and embodiments are to considered as illustrative and not restrictive and the invention is not to be limited to the details given herein, but may be modified within the scope of the appended claims.

What is claimed is:

1. A method for producing a displacement magnifying device for a piezoelectric element wherein the displacement of the piezoelectric element, in a given direction caused by applied voltage is transmitted to a contact member and is magnified by the contact member and a displacement magnifying mechanism, the method comprising the steps of:

assembling a frame, the contact member, the piezoelectric element and a temperature compensating member having a temperature expansion characteristic reverse to that of the piezoelectric element;

plastically deforming the temperature compensating member in the direction of displacement of the piezoelectric element by pressing sides of the temperature compensating member in a direction perpendicular to the direction of displacement;

measuring a displacement amount caused by the plastic deformation of the temperature compensating member by measuring the amount of displacement of at least one of the contact member and the displacement magnifying mechanism; and releasing the pressure against the temperature compensating member when the measured displacement amount reaches a predetermined value.

2. A method for producing a displacement magnifying device of a piezoelectric element as set forth in claim 1 wherein said piezoelectric element is placed between the frame and the contact member after the frame and the contact member are coupled.

3. A method for producing a displacement magnifying device of a piezoelectric element as set forth in claim 1 wherein said displacement magnifying mechanism comprises:

a pair of opposing leaf springs fixed to first ends of the contact member and of the frame respectively;

a rocking block carried by second ends of the leaf spring; and a rocking arm having a proximal end fixed to the rocking block.

4. A method for producing a displacement magnifying device of a piezoelectric element as set forth in claim 3 wherein a printing wire is attached to a tip of the rocking arm

5. A method for producing a displacement magnifying device of a piezoelectric element as set forth in claim 1 wherein the pressed side surfaces of the temperature compensating member are pressed in a direction perpendicular to the direction of displacement of the piezoelectric element to plastically deform the temperature compensating member in the direction of displacement.

6. A method for producing a displacement magnifying device of a piezoelectric element as set forth in claim 5 wherein pressure is directly applied to only a portion of the pressed side surfaces of the temperature compensating member, either adjacent to the frame or adjacent to the contact member, said pressure being applied in the direction perpendicular to the direction of displacement of the piezoelectric element.

7. A method for producing a displacement magnifying device of a column shaped piezoelectric element in a printing head wherein the displacement of the column shaped piezoelectric element in a given direction caused by applied voltage is magnified via a displacement magnifying mechanism and is transferred to a printing wire to drive the printing wire, the method comprising the steps of:

assembling a frame, a contact member, the piezoelectric element and a temperature compensating member having a temperature expansion characteristic reverse to that of the piezoelectric element in a predetermined order;

plastically deforming the temperature compensating member in the direction of displacement of the piezoelectric element by pressing either halves of sides of the temperature compensating member in a direction perpendicular to the direction of displacement;

measuring a displacement amount of at least one of the contact member and the displacement magnifying mechanism caused by the plastic deformation; and releasing the pressure against the temperature compensating member when the measured displacement amount reaches a predetermined value.

8. A method for producing a displacement magnifying device of a piezoelectric element as set forth in claim 7 wherein said piezoelectric element is disposed between the frame and the contact member after these are assembled.

9. A method for producing a displacement magnifying device of a piezoelectric element as set forth in claim 8 wherein halves of both the side surfaces of the temperature compensating member either adjacent to the frame or adjacent to the contact member are pressed in the direction perpendicular to the direction of displacement of the piezoelectric element.

* * * * *